(12) United States Patent
Nishida (10) Patent No.: US 11,996,709 B2
(45) Date of Patent: May 28, 2024

(54) BATTERY IDENTIFICATION SYSTEM AND BATTERY IDENTIFICATION METHOD

(71) Applicant: HONDA MOTOR CO., LTD., Tokyo (JP)

(72) Inventor: Yoshikazu Nishida, Wako (JP)

(73) Assignee: HONDA MOTOR CO., LTD., Tokyo (JP)

(\*) Notice: Subject to any disclaimer, the term of this patent is extended or adjusted under 35 U.S.C. 154(b) by 388 days.

(21) Appl. No.: 17/426,117

(22) PCT Filed: Nov. 5, 2019

(86) PCT No.: PCT/JP2019/043305
§ 371 (c)(1),
(2) Date: Jul. 28, 2021

(87) PCT Pub. No.: WO2020/161972
PCT Pub. Date: Aug. 13, 2020

(65) Prior Publication Data
US 2022/0085627 A1    Mar. 17, 2022

(30) Foreign Application Priority Data

Feb. 4, 2019    (JP) .................................. 2019-018106

(51) Int. Cl.
*H02J 7/00*    (2006.01)
*B60L 58/13*    (2019.01)
(Continued)

(52) U.S. Cl.
CPC .......... *H02J 7/00041* (2020.01); *B60L 58/13* (2019.02); *G01R 31/382* (2019.01); *H01M 10/48* (2013.01); *H02J 7/0048* (2020.01)

(58) Field of Classification Search
CPC ..... H02J 7/00041; H02J 7/0048; B60L 58/13; B60L 2250/16; B60L 53/65; B60L 53/66;
(Continued)

(56) References Cited

U.S. PATENT DOCUMENTS

2013/0096858 A1    4/2013    Amano et al.
2015/0251556 A1    9/2015    Meyer
(Continued)

FOREIGN PATENT DOCUMENTS

CN    103048625    4/2013
CN    105270194    1/2016
(Continued)

OTHER PUBLICATIONS

International Search Report and Written Opinion for International Application No. PCT/JP2019/043305 dated Feb. 4, 2020, 11 pages.
(Continued)

*Primary Examiner* — Paul Dinh
(74) *Attorney, Agent, or Firm* — Amin, Turocy & Watson, LLP (57) ABSTRACT

The present invention includes an information acquirer (21) configured to acquire a property of a battery (22) installed in an electric vehicle (20) and transmit the property as battery property information and a battery identification device
(Continued)

(100) configured to collect the battery property information transmitted by a plurality of electric vehicles, generate a battery model by modeling the property of the battery on the basis of the collected battery property information, create control information according to the property of the battery for controlling traveling of each electric vehicle on the basis of the generated battery model, and provide the control information suitable for each electric vehicle.

6 Claims, 4 Drawing Sheets

(51) Int. Cl.
*G01R 31/382* (2019.01)
*H01M 10/48* (2006.01)

(58) Field of Classification Search
CPC ..... B60L 53/68; G01R 31/382; G01R 31/007; G01R 31/371; H01M 10/48; Y02T 10/7072; Y02T 90/12; Y02T 90/16; Y02T 90/167; Y04S 30/12; Y04S 30/14
USPC .......................................................... 320/106
See application file for complete search history.

(56) References Cited

U.S. PATENT DOCUMENTS

| | | | |
|---|---|---|---|
| 2016/0006377 | A1 | 1/2016 | Hashimoto |
| 2018/0050601 | A1 | 2/2018 | Katanoda |
| 2020/0055421 | A1* | 2/2020 | Sastinsky ................ G06F 16/27 |
| 2020/0269719 | A1* | 8/2020 | Aykol ...................... B60L 53/30 |
| 2020/0376979 | A1* | 12/2020 | Liang ...................... B60L 53/80 |

FOREIGN PATENT DOCUMENTS

| | | |
|---|---|---|
| CN | 107757391 | 3/2018 |
| JP | 2006-211789 | 8/2006 |
| JP | 4960022 | 6/2012 |
| JP | 2013-089424 | 5/2013 |
| JP | 2016-013819 | 1/2016 |
| JP | 2017-028874 | 2/2017 |
| JP | 6207127 | 10/2017 |
| JP | 2018-148649 | 9/2018 |
| WO | 2016/071941 | 5/2016 |

OTHER PUBLICATIONS

Chinese Office Action for Chinese Patent Application No. 201980089987.X dated Nov. 11, 2023.

* cited by examiner

BATTERY IDENTIFICATION SYSTEM AND BATTERY IDENTIFICATION METHOD

TECHNICAL FIELD

The present invention relates to a battery identification system and a battery identification method.

Priority is claimed on Japanese Patent Application No. 2019-018106, filed Feb. 4, 2019, the content of which is incorporated herein by reference.

BACKGROUND ART

In recent years, electric vehicles such as battery electric vehicles (BEVs) and hybrid electric vehicles (HEVs), which travel using electric motors driven with electric power supplied from secondary batteries (batteries), have been developed and have begun to gain popularity. Also, some electric vehicles in recent years have been able to use a secondary battery (a removable battery) configured to be removable. Current electric vehicles are limited to the installation of batteries certified by an electric vehicle provider (manufacturer) verifying compatibility with the electric vehicle. This is because, from the viewpoint of control in an electric vehicle, control information necessary for the traveling of the electric vehicle (for example, control software or the like in an electronic control unit (ECU) provided in the electric vehicle) is optimized in accordance with properties of a secondary battery (hereinafter referred to as battery properties). On the other hand, in recent years, standardization of a battery pack (hereinafter referred to as an "in-vehicle battery") into which a secondary battery capable of being used in an electric vehicle has been built has been studied.

By the way, some secondary batteries are developed and manufactured by various manufacturers and sold at low cost. Thus, even if the standardization of in-vehicle batteries progresses, it is expected that the external shape, the size, and the like will be unified, but the battery properties of built-in secondary batteries will not be unified. A case in which a secondary battery having various battery properties is built into the in-vehicle battery used in an electric vehicle is conceivable. In this case, the user of the electric vehicle may select an in-vehicle battery, which has the same shape but is not certified, and install the selected in-vehicle battery in the electric vehicle.

For this reason, from the viewpoint of control in an electric vehicle, the manufacturer of an electric vehicle needs to prepare and provide control information optimized for each of battery properties of secondary batteries built into in-vehicle batteries including an uncertified in-vehicle battery (i.e., each of in-vehicle batteries). Thus, manufacturers of electric vehicles need to acquire the battery properties of various in-vehicle batteries that are likely to be installed.

In relation to the above, various technologies for acquiring battery properties have been disclosed (see Patent Document 1 and Patent Document 2). Patent Document 1 discloses a measurement system including a battery pack containing a battery and at least one type of connected device to which the battery pack is connected. In the technology disclosed in Patent Document 1, an electric current a battery discharged is detected in a first measurement range, an electric current with which the battery is charged is detected in a second measurement range smaller than the first measurement range, and the charge capacity of the battery is calculated. Also, as described in Patent Document 2, a battery pack includes a secondary battery; a voltage detection means for detecting a cell voltage of the secondary battery; an electric current detection means for detecting an electric current with which the secondary battery is charged and discharged, a communication means for communicating with at least one of a charger and a load device, and a charging control means for requesting a charger to provide an electric current with which the secondary battery is charged via the communication means and controlling the electric current with which the secondary battery is charged in response to detection results of the voltage detection means and the electric current detection means. In the technology disclosed in Patent Document 2, the charging control means receives a terminal voltage of a charging/discharging terminal of the battery pack from the charger or the load device via the communication means and obtains a path resistance value of a charging/discharging path for use in charging/discharging by dividing a difference between the terminal voltage and a cell voltage detected by the voltage detection means by an electric current value detected by the current detection means.

CITATION LIST

Patent Document

[Patent Document 1]
Japanese Patent No. 6207127
[Patent Document 2]
Japanese Patent No. 4960022

SUMMARY OF INVENTION

Technical Problem

However, because secondary batteries are developed, manufactured, and sold by various manufacturers and are also selected by users of electric vehicles, a process of providing control information optimized for battery properties of various in-vehicle batteries in the future is a significant burden on electric vehicle manufacturers and is difficult.

The present invention has been made on the basis of the above-mentioned problem recognition and an objective of the present invention is to provide a battery identification system and a battery identification method for providing control information suitable for batteries having different properties by acquiring and collecting information about properties of batteries.

Solution to Problem (1): According to an aspect of the present invention for achieving the aforementioned objective, there is provided a battery identification system including: an information acquirer configured to acquire a property of a battery installed in an electric vehicle and transmit the property as battery property information; and a battery identification device configured to collect the battery property information transmitted by a plurality of electric vehicles, generate a battery model by modeling the property of the battery on the basis of the collected battery property information, create control information according to the property of the battery for controlling traveling of each electric vehicle on the basis of the generated battery model, and provide the control information suitable for each electric vehicle.

(2): In the above-described aspect (1), the battery identification device includes a controller configured to ascertain the property of the battery and instruct to generate the battery model and create the control information; a model generator configured to generate the battery model on the basis of the collected battery property information; a control information creator configured to create the control information suitable for the property of the battery on the basis of the battery model; and a communicator configured to receive the battery property information transmitted by the electric vehicle and transmit the control information suitable for the electric vehicle.

(3): In the above-described aspect (2), the battery property information includes at least the electric current, the voltage, and the temperature of the battery, the model generator is configured to generate the battery model for receiving at least the electric current, the voltage, and the temperature as input information and outputting at least one of internal resistance, a capacity, and a state of charge (SOC)-open circuit voltage (OCV) curve of the battery as output information, and the control information creator is configured to create the control information using the output information consisting of the battery model.

(4): In the above-described aspect (3), the model generator is configured to generate the battery model for outputting at least one of a type, an SOC, and an output of the battery as presentation information, and the controller is configured to ascertain the property of the battery using the presentation information of the battery model.

(5): In the above-described aspect (4), the controller is configured to cause the communicator to transmit information about the ascertained property of the battery in a case where the ascertained property of the battery is not suitable for controlling the traveling of the electric vehicle.

(6): In any one of the above-described aspects (1) to (5), the information acquirer includes a battery detector configured to detect the electric current, the voltage, and the temperature of the battery; and a communication device configured to transmit the electric current, the voltage, and the temperature that have been detected.

(7): According to an aspect of the present invention, there is provided a battery identification method including: acquiring, by an information acquirer, a property of a battery installed in an electric vehicle and transmitting the property as battery property information; and collecting, by a battery identification device, the battery property information transmitted by information acquirers provided in a plurality of electric vehicles, generating a battery model by modeling the property of the battery on the basis of the collected battery property information, creating control information according to the property of the battery for controlling traveling of each electric vehicle on the basis of the generated battery model, and providing the control information suitable for each electric vehicle.

Advantageous Effects of Invention

According to the configurations of the above-described (1) to (7), the information acquirer and the battery identification device are provided. Because the information acquirer acquires properties of a battery installed in an electric vehicle and transmits the properties as battery property information and the battery identification device collects the battery property information transmitted by information acquirers provided in a plurality of electric vehicles, generates a battery model by modeling the properties of the battery on the basis of the collected battery property information, creates control information according to the properties of the battery for controlling traveling of each electric vehicle on the basis of the generated battery model, and provides the control information suitable for each electric vehicle, it is possible to provide control information suitable for batteries whose properties are different.

DESCRIPTION OF EMBODIMENTS

Figure 1:
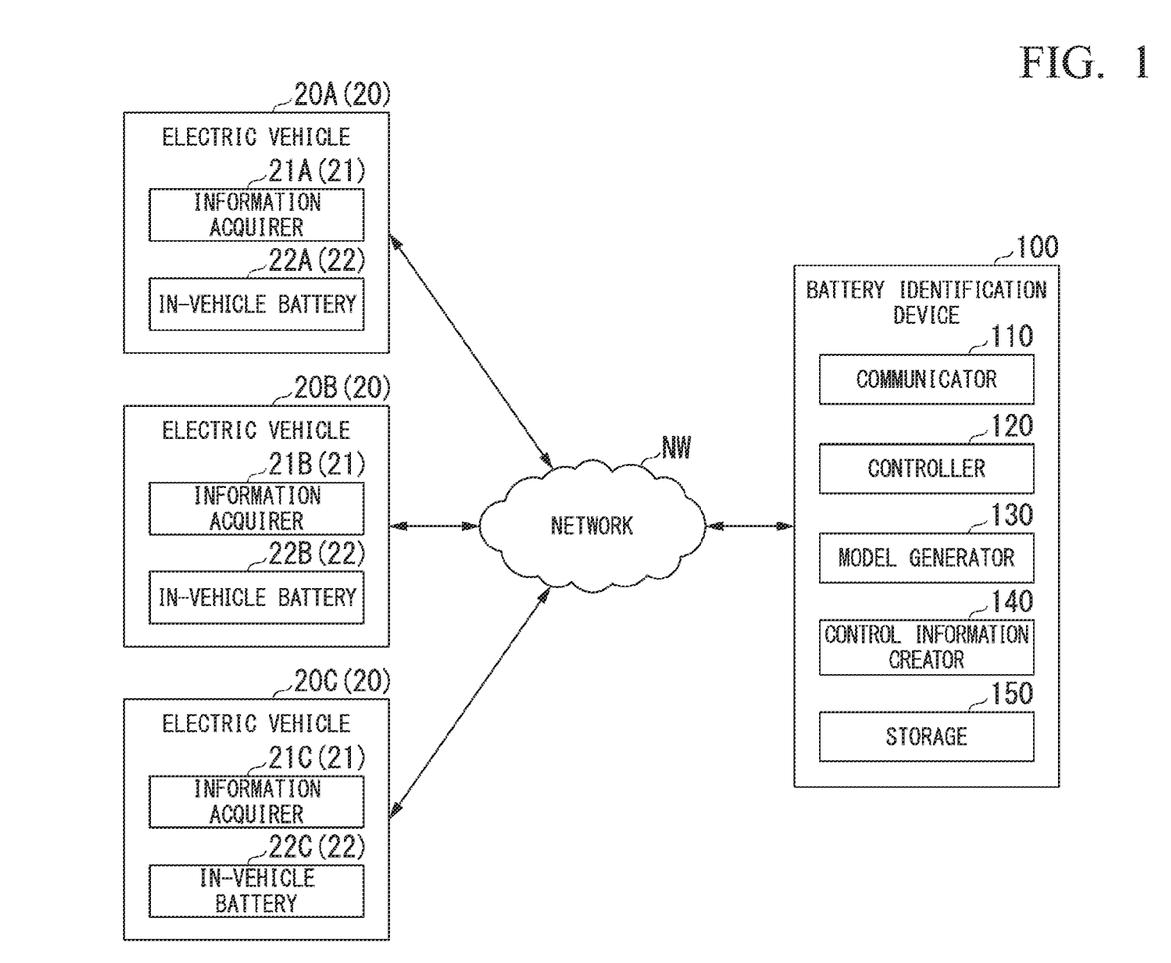
FIG. 1 is a block diagram showing a schematic configuration of a battery identification system of the present embodiment.

Hereinafter, embodiments of the present invention will be described with reference to the drawings. FIG. 1 is a block diagram showing a schematic configuration of a battery identification system of the present embodiment. A battery identification system 1 shown in FIG. 1 includes a battery identification device 100 and an electric vehicle 20. Also, the battery identification device 100 includes a communicator 110, a controller 120, a model generator 130, a control information creator 140, and a storage 150. Also, the electric vehicle 20 includes an information acquirer 21 and an in-vehicle battery 22. That is, the in-vehicle battery 22 is installed in the electric vehicle 20.

The battery identification system 1 includes a battery identification device 100 and an information acquirer 21 provided in the electric vehicle 20. In the battery identification system 1, the battery identification device 100 and the information acquirer 21 are connected via a network NW. Also, the network NW is a communication network for wireless communication including, for example, the Internet, a wide area network (WAN), a local area network (LAN), a provider device, a radio base station, and the like.

Although an example in which three electric vehicles 20 (an electric vehicle 20A, an electric vehicle 20B, and an electric vehicle 20C) are included in the battery identification system 1 shown in FIG. 1 is shown, the number of electric vehicles 20 included in the battery identification system 1 is not limited to three and may be one, two, or four or more. In the following description, a letter "A," "B," or "C" for distinguishing the electric vehicles 20 is attached after the reference numeral of each component so that the information acquirers 21 and the in-vehicle batteries 22 provided in the electric vehicles 20 are distinguished.

The battery identification system 1 acquires and collects properties (battery properties) of the secondary battery built into the in-vehicle battery 22 from a plurality of electric vehicles 20. Here, the electric vehicle 20 is not always equipped with an identical in-vehicle battery 22 and may be equipped with a different in-vehicle battery 22 through replacement. Thus, the battery identification system 1 acquires the battery properties of the secondary battery built into the currently installed in-vehicle battery 22 from each of the electric vehicles 20 traveling with the in-vehicle battery 22 that has been actually installed. Thereby, the battery identification system 1 can also collect the battery properties of the secondary battery built into each of in-vehicle batteries 22 that include different in-vehicle batteries 22 and are likely to be reused in a plurality of electric vehicles 20.

The battery identification system 1 generates a battery model by modeling the properties of each in-vehicle battery 22 (i.e., the secondary battery built into the in-vehicle battery 22) on the basis of the collected battery properties and ascertains the properties of the in-vehicle battery 22. The battery identification system 1 generates control information (for example, control software, control parameters, and the like) optimized by an electronic control unit (ECU) provided in the electric vehicle 20 to control the traveling of the electric vehicle 20 for each in-vehicle battery 22 on the basis of the ascertained properties of the in-vehicle battery 22. The battery identification system 1 provides the control information optimized for the in-vehicle battery 22 currently installed in the electric vehicle 20 to each electric vehicle 20 (more specifically, the ECU).

Also, the battery identification system 1 can also notify the electric vehicle 20 of the ascertained properties of the in-vehicle battery 22 when the properties are not suitable for controlling the traveling of the electric vehicle 20.

The electric vehicle 20 is a vehicle that travels using an electric motor driven with electric power supplied from the in-vehicle battery 22. Also, for example, the electric vehicle 20 includes all electric vehicles, each of which performs traveling using an electric motor driven with electric power supplied from the in-vehicle battery 22, such as a saddle-type two-wheeled vehicle, a three-wheeled vehicle (including a two front-wheeled and one rear-wheeled vehicle in addition to a one front-wheeled and two rear-wheeled vehicle), and an assisted bicycle as well as a four-wheeled vehicle.

The in-vehicle battery 22 is a power storage device that incorporates a secondary battery that can be iteratively charged and discharged and is installed in the electric vehicle 20. Also, the in-vehicle battery 22 may be, for example, a cassette-type power storage device (a removable battery) that is removably installed in the electric vehicle 20. The in-vehicle battery 22 supplies electric power to the electric motor provided in the electric vehicle 20 by discharging the built-in secondary battery. As an example of the secondary battery installed in the in-vehicle battery 22, a capacitor such as an electric double layer capacitor, a composite battery in which a secondary battery and a capacitor are combined, or the like in addition to a lead storage battery, a nickel-hydride battery, a lithium-ion battery, a sodium ion battery, or the like is conceivable. Also, in the present invention, the configurations of the in-vehicle battery 22 and the secondary battery built into the in-vehicle battery 22 are not particularly specified. Also, when the in-vehicle battery 22 has a configuration of a removable battery, the in-vehicle battery 22 can be used in a plurality of electric vehicles 20. That is, the in-vehicle battery 22 can be shared by the plurality of electric vehicles 20.

The information acquirer 21 acquires the battery properties of the secondary battery by detecting the state of the secondary battery built into the in-vehicle battery 22 installed in the electric vehicle 20. Here, the battery properties acquired by the information acquirer 21 include states (values) of an electric current, a voltage, a temperature, and the like of the secondary battery. Also, the battery properties may include the elapsed time from the time when the in-vehicle battery 22 (or the secondary battery) has been manufactured. Also, the battery properties may include identification information (a battery ID) such as a serial number exclusively assigned to the in-vehicle battery 22. The information acquirer 21 transmits information consisting of the acquired battery properties (hereinafter referred to as "battery property information") to the battery identification device 100 via the network NW using a communication device (not shown).

The battery identification device 100 collects the battery property information transmitted by the information acquirer 21 provided in each electric vehicle 20, and generates a battery model by modeling the properties of the in-vehicle battery 22 on the basis of the collected battery property information. More specifically, the battery identification device 100 generates a battery model of the secondary battery built into the in-vehicle battery 22 on the basis of states of the electric current, the voltage, the temperature, and the like of the secondary battery included in the battery property information. Here, the battery model can be used for ascertaining the properties of the secondary battery, setting a charging/discharging control method, and the like. Also, when the battery property information includes the elapsed time, the battery identification device 100 may generate a battery model including the elapsed time. In this case, the battery model can also be used for estimating the lifespan of the secondary battery, determining a failure, and the like.

Also, the battery identification device 100 ascertains the properties of the secondary battery on the basis of the battery model and sets an optimum discharging control method. That is, the battery identification device 100 sets an optimum power supply method when electric power is supplied to the electric motor in the electric vehicle 20 equipped with the in-vehicle battery 22. The battery identification device 100 supplies electric power to the electric motor by a power supply method set by the ECU provided in the electric vehicle 20, i.e., creates the control information optimized for the ECU to control the traveling of the electric vehicle 20. Here, the control information of the ECU created by the battery identification device 100 may be control information common to the ECUs provided in the electric vehicles 20, i.e., a plurality of ECUs, or control information for each ECU. The battery identification device 100 transmits the created control information to the information acquirer 21 provided in the electric vehicle 20 that has transmitted the battery property information via the network NW.

Also, for example, in a case in which the in-vehicle battery 22 currently installed in the electric vehicle 20 is not suitable for controlling traveling such as a case in which the secondary battery is approaching the end of its lifespan estimated on the basis of the battery model or a case in which a failure of the secondary battery is determined, the battery identification device 100 transmits information representing the above case to the information acquirer 21 provided in the electric vehicle 20 that has transmitted the battery property information. Thereby, the information acquirer 21 can notify the user of the electric vehicle 20 of the transmitted information.

Also, for example, each component provided in the battery identification device 100 includes a processor such as a central processing unit (CPU) and a storage device storing a program (a storage device including a non-transitory storage medium) and the processor implements various types of functions by executing the program. Some or all of the functions of these components provided in the battery identification device 100 may be implemented by hardware (including a circuit unit; circuitry) such as a large scale integration (LSI) circuit, an application specific integrated circuit (ASIC), a field-programmable gate array (FPGA), or a graphics processing unit (GPU) or may be implemented by software and hardware in cooperation. Also, some or all of functions of these components provided in the battery identification device 100 may be implemented by a dedicated LSI circuit. The program may be pre-stored in a storage device (a storage device having a non-transient storage medium) such as a hard disk drive (HDD) or a flash memory or may be stored in a removable storage medium (a non-transient storage medium) such as a DVD or a CD-ROM and installed when the storage medium is installed in a drive device. Also, the battery identification device 100 may be implemented in a server device or a storage device incorporated in a cloud computing system. In this case, the function of the battery identification device 100 may be implemented by a plurality of server devices and storage devices in the cloud computing system.

The communicator 110 communicates with the information acquirer 21 provided in the electric vehicle 20 to exchange information. More specifically, the communicator 110 receives the battery property information transmitted by the information acquirer 21 provided in each electric vehicle 20. That is, the communicator 110 receives battery property information of the in-vehicle battery 22A transmitted by the information acquirer 21A provided in the electric vehicle 20A, battery property information of the in-vehicle battery 22B transmitted by the information acquirer 21B provided in the electric vehicle 20B, and battery property information of the in-vehicle battery 22C transmitted by the information acquirer 21C provided in the electric vehicle 20C. Also, the communicator 110 transmits the control information created by the control information creator 140, which will be described below, to the information acquirer 21 provided in the corresponding electric vehicle 20. That is, the communicator 110 transmits control information corresponding to the ECU provided in the electric vehicle 20A to the information acquirer 21A, transmits control information corresponding to the ECU provided in the electric vehicle 20B to the information acquirer 21B, and transmits control information corresponding to the ECU provided in the electric vehicle 20C to the information acquirer 21C.

The controller 120 collects the battery property information received by the communicator 110. That is, the controller 120 acquires battery property information of the in-vehicle battery 22A installed in the electric vehicle 20A, battery property information of the in-vehicle battery 22B installed in the electric vehicle 20B, and battery property information of the in-vehicle battery 22C installed in the electric vehicle 20C. The controller 120 collects the acquired battery property information by causing the storage 150 to store the acquired battery property information. Also, the controller 120 instructs the model generator 130 to generate a battery model based on the battery property information stored in the storage 150. Also, the controller 120 ascertains the battery properties of the secondary battery built into the in-vehicle battery 22 currently installed in the electric vehicle 20 on the basis of the battery model generated by the model generator 130.

Also, the in-vehicle batteries 22 respectively installed in the electric vehicle 20A, the electric vehicle 20B, and the electric vehicle 20C are not necessarily the same in-vehicle battery 22. That is, the secondary batteries respectively built into the in-vehicle battery 22A, the in-vehicle battery 22B, and the in-vehicle battery 22C are not necessarily manufactured by the same secondary battery manufacturer. Also, even if the secondary batteries respectively built into the in-vehicle batteries 22 are manufactured by the same manufacturer, these are not necessarily secondary batteries manufactured at the same time or in the same configuration. Thus, the controller 120 basically causes the model generator 130 to generate a battery model for each battery property information element, i.e., for each in-vehicle battery 22. After it is confirmed that the battery model generated by the model generator 130 is a battery model of a secondary battery having identical battery properties, the controller 120 performs a process such as integrating the battery models. On the other hand, when the electric vehicles 20 are equipped with the same in-vehicle battery 22, the model generator 130 has already generated the battery model on the basis of the battery property information previously acquired from the electric vehicles 20. In this case, the controller 120 may or may not replace the battery model previously generated by the model generator 130 with the battery model currently generated by the model generator 130. A determination of the replacement is made according to, for example, whether a difference between a date and time when the battery model was previously created and a current date and time is greater than or equal to a predetermined difference, i.e., whether or not a predetermined time period has elapsed after the creation of the previous battery model. In this way, the controller 120 prevents duplicate collection of the same battery model. Thereby, in the battery identification system 1, even if a new in-vehicle battery is introduced to the market or the like, battery models of secondary batteries having different battery properties or a newer battery model are added or updated and a plurality of information elements can be collected.

The controller 120 determines whether or not control information corresponding to a secondary battery having battery properties identical to the ascertained battery properties has already been stored in the storage 150. As a result, when the control information corresponding to the secondary battery having the identical battery properties has been stored in the storage 150, the controller 120 instructs the communicator 110 to transmit the stored control information and causes the control information to be transmitted to the electric vehicle 20 that has transmitted the battery property information. On the other hand, when the control information corresponding to the secondary battery having the identical battery properties has not been stored in the storage 150, the controller 120 instructs the control information creator 140 to create the control information based on the battery model generated by the model generator 130. Subsequently, the controller 120 instructs the communicator 110 to transmit the control information created by the control information creator 140 and causes the control information to be transmitted to the electric vehicle 20 that has transmitted the battery property information.

Also, in a case in which the ascertained battery properties are not suitable for controlling the traveling of the electric vehicle 20, the controller 120 instructs the communicator 110 to transmit information about the secondary battery representing the above case and causes the information to be transmitted to the electric vehicle 20 that has transmitted the battery property information.

The model generator 130 generates a battery model of a secondary battery built into the in-vehicle battery 22 on the basis of the battery property information collected by the controller 120 and stored in the storage 150 in accordance with an instruction from the controller 120. More specifically, the model generator 130 generates a battery model by modeling the properties of each secondary battery on the basis of states of an electric current, a voltage, a temperature, and the like of the secondary battery included in the battery property information. When the model generator 130 has already generated the battery model of the identical secondary battery, the model generator 130 updates the generated battery model on the basis of the states of the electric current, the voltage, the temperature, and the like of the secondary battery included in the battery property information. The model generator 130 causes the storage 150 to store the generated or updated battery model. Also, when the battery property information includes the elapsed time, the model generator 130 generates a battery model including the elapsed time and causes the storage 150 to store the generated battery model.

The control information creator 140 sets an optimum discharging control method for the secondary battery on the basis of the battery model generated by the model generator 130 and stored in the storage 150 in accordance with an instruction from the controller 120 and creates control information of the ECU. The control information creator 140 causes the storage 150 to store the created control information. Also, the electric vehicle 20A, the electric vehicle 20B, and the electric vehicle 20C are not necessarily vehicles of the same vehicle type. Thus, the ECU provided in each electric vehicle 20 does not always control the traveling of the electric vehicle 20 by controlling the driving of the electric motor in an identical control method. Thus, the controller 120 creates optimized control information for each type of ECU provided in the electric vehicle on the market. Also, when the identical battery model of the secondary battery has been updated, the control information creator 140 creates the optimized ECU control information on the basis of the updated battery model and updates corresponding control information stored in the storage 150.

The storage 150 stores various data of each processing stage performed in the battery identification device 100. The storage 150 includes a storage device (a memory) such as a read only memory (ROM), a random access memory (RAM), an HDD, or a flash memory. When the battery identification device 100 is implemented in a server device or a storage device incorporated in the cloud computing system, the storage 150 is implemented as a storage device, i.e., a database, in the cloud computing system that stores the battery model and the control information.

According to the above configuration, in the battery identification system 1, the battery property information of the currently installed in-vehicle battery 22 is acquired from each electric vehicle 20, the currently installed in-vehicle battery 22 is ascertained on the basis of the acquired battery property information, and the control information of the ECU optimized for the in-vehicle battery 22 is provided to the corresponding electric vehicle 20. Thereby, the ECU provided in the electric vehicle 20 can control the traveling of the electric vehicle 20 on the basis of the optimized control information. Thereby, the user of the electric vehicle 20 can select the in-vehicle battery 22 regardless of the manufacturer of the in-vehicle battery 22 installed in the electric vehicle 20. Also, the manufacturer of the secondary battery can enter the market of the electric vehicle 20 as a supplier of the in-vehicle battery 22.

Figure 2:
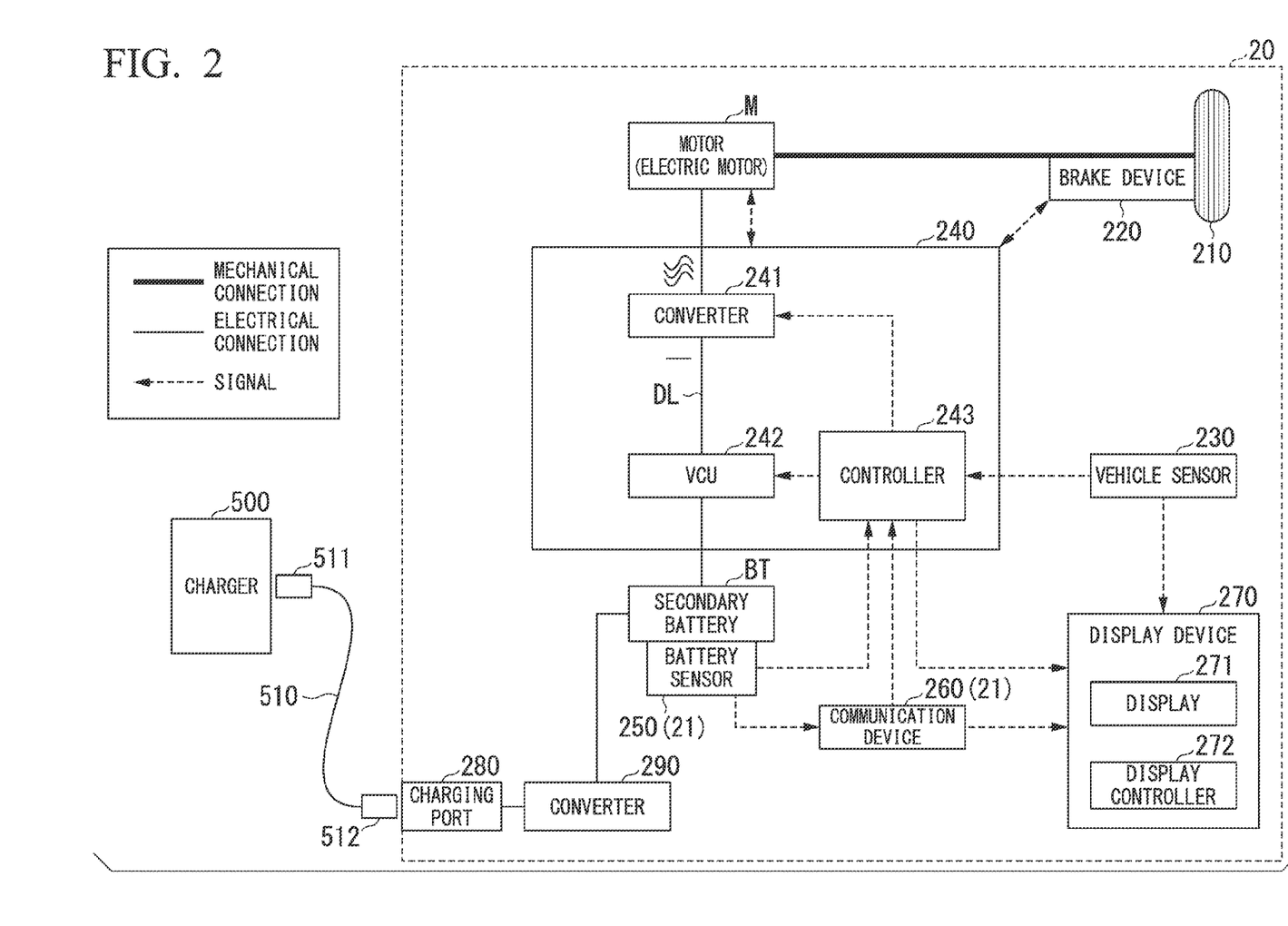
FIG. 2 is a diagram showing an example of a configuration of an electric vehicle included in the battery identification system.

Next, an example of the electric vehicle 20 including the information acquirer 21 constituting the battery identification system 1 will be described. FIG. 2 is a diagram showing an example of the configuration of the electric vehicle 20 included in the battery identification system 1. The electric vehicle 20 shown in FIG. 2 includes, for example, an electric motor M, a drive wheel 210, a brake device 220, a vehicle sensor 230, a power control unit (PCU) 240, a battery sensor 250, a communication device 260, a display device 270, a charging port 280, and a converter 290. In the battery identification system 1, the information acquirer 21 includes a battery sensor 250 and a communication device 260.

The electric motor M is, for example, a three-phase alternating current (AC) motor. The rotor of the electric motor M is connected to the drive wheel 210. The electric motor M is driven by the electric power supplied from a secondary battery BT built into the in-vehicle battery 22 and transfers rotating motive power to the drive wheel 210. Also, the electric motor M generates electric power using the kinetic energy of the electric vehicle 20 when the electric vehicle 20 is decelerated.

The brake device 220 includes, for example, a brake caliper, a cylinder that transfers hydraulic pressure to the brake caliper, and an electric motor that generates hydraulic pressure in the cylinder. The brake device 220 may include a mechanism that transfers hydraulic pressure generated by a user (a driver) of the electric vehicle 20 operating a brake pedal (not shown), which is an example of an operation element for receiving a deceleration instruction from the driver of the electric vehicle 20, to the cylinder via a master cylinder as a backup. Also, the brake device 220 is not limited to the above-described configuration and may be an electronically controlled hydraulic brake device that transfers the hydraulic pressure of the master cylinder to the cylinder.

The vehicle sensor 230 includes an accelerator opening degree sensor, a vehicle speed sensor, and a brake depression amount sensor. The accelerator opening degree sensor is attached to an accelerator pedal, which is an example of an operation element for receiving an acceleration instruction from the driver of the electric vehicle 20, detects an amount of operation of the accelerator pedal by the driver of the electric vehicle 20, and outputs the detected amount of operation as an accelerator opening degree to the controller 243. Also, the vehicle speed sensor includes, for example, a wheel speed sensor and a speed calculator attached to each wheel of the electric vehicle 20 and combines wheel speeds detected by the wheel speed sensors to derive the speed of the electric vehicle 20 (a vehicle speed) and outputs the derived speed to the controller 243 and the display device 270. Also, the brake depression amount sensor is attached to the brake pedal, detects the amount of operation of the brake pedal by the driver, and outputs the detected amount of operation as an amount of brake depression to the controller 243.

The PCU 240 includes, for example, a converter 241, a voltage control unit (VCU) 242, and a controller 243. Although an example in which the above-described components are collectively configured as a PCU 240 is shown in FIG. 2, this is only an example. The above components may be disposed in a distributed manner in the electric vehicle 20.

The converter 241 is, for example, an AC-direct current (DC) converter. A DC side terminal of the converter 241 is connected to a DC link DL. The secondary battery BT is connected to the DC link DL via the VCU 242. The converter 241 converts an AC generated by the electric motor M into a DC and outputs the DC to the DC link DL.

The VCU 242 is, for example, a DC-DC converter. The VCU 242 boosts electric power supplied from the secondary battery BT and outputs the boosted electric power to the DC link DL.

The controller 243 is an ECU that controls the traveling of the electric vehicle 20. The controller 243 includes, for example, a motor controller, a brake controller, and a battery/VCU controller. The motor controller, the brake controller, and the battery/VCU controller may be replaced with separate control devices such as a motor ECU, a brake ECU, and a battery ECU, respectively.

The motor controller controls the driving of the electric motor M on the basis of the output from the accelerator opening degree sensor provided in the vehicle sensor 230. The motor controller controls the driving of the electric motor M on the basis of, for example, control information of an initial value, when the control information has not been transmitted from the battery identification device 100 and controls the driving of the electric motor M on the basis of transmitted control information when the control information has been transmitted from the battery identification device 100.

The brake controller controls the brake device 220 on the basis of the output from the brake depression amount sensor provided in the vehicle sensor 230.

The battery/VCU controller calculates a state of charge (SOC) of the secondary battery BT on the basis of an output from the battery sensor 250 attached to the secondary battery BT and outputs the calculated SOC to the VCU 242 and the display device 270. Thereby, the VCU 242 boosts the voltage of the DC link DL in accordance with an instruction from the battery/VCU controller. Also, the display device 270 causes SOC information and the like calculated by the battery/VCU controller to be displayed.

The secondary battery BT is a secondary battery built into the in-vehicle battery 22, stores electric power introduced from the external charger 500 of the electric vehicle 20, and is discharged with the stored electric power for traveling of the electric vehicle 20.

The battery sensor 250 is, for example, a battery detector including an electric current sensor, a voltage sensor, and a temperature sensor. The battery sensor 250 detects an electric current of the secondary battery BT using the electric current sensor, detects a voltage of the secondary battery BT using the voltage sensor, and detects a temperature of the secondary battery BT using the temperature sensor. The battery sensor 250 outputs information such as the detected electric current, voltage, and temperature of the secondary battery BT to the controller 243 and the communication device 260.

The communication device 260 includes a wireless module for connecting to a wireless communication network (a mobile communication network) such as a cellular network or a WiFi (registered trademark) network. The communication device 260 transmits information such as the electric current, the voltage, and the temperature of the secondary battery BT output from the battery sensor 250 to the battery identification device 100 via the network NW (see FIG. 1) as battery property information. At this time, the communication device 260 may add identification information such as identification information (a vehicle ID) of the electric vehicle 20 itself and identification information (a battery ID) of the in-vehicle battery 22 to the battery property information and transmit the identification information added to the battery property information to the battery identification device 100. Also, the communication device 260 receives the information transmitted by the battery identification device 100 via the network NW. More specifically, the communication device 260 receives the control information of the ECU transmitted by the battery identification device 100, i.e., the control information of the controller 243. The communication device 260 outputs the received control information to the controller 243. Also, the communication device 260 receives information about the secondary battery BT transmitted by the battery identification device 100 (for example, error information representing that the secondary battery BT is approaching the end of its lifespan, that the failure of the secondary battery BT is determined, or the like). The communication device 260 outputs the received information about the secondary battery BT to the display device 270.

The display device 270 includes, for example, a display 271 and a display controller 272. The display 271 displays various information in the electric vehicle 20 in accordance with the control of the display controller 272. The display controller 272 controls the display of information on the display 271. More specifically, the display controller 272 causes the display 271 to display the information about control of the traveling of the electric vehicle 20 output from the controller 243. Also, the display controller 272 causes the display 271 to display information about the secondary battery BT (the error information or the like) output from the communication device 260. Also, the display controller 272 causes the display 271 to display information such as the vehicle speed output from the vehicle sensor 230.

The charging port 280 is a mechanism for charging the secondary battery BT in a state in which the secondary battery BT is connected, i.e., in a state in which the in-vehicle battery 22 is installed in the electric vehicle 20. The charging port 280 is provided toward the outside of the vehicle body of the electric vehicle 20. The charger 500 is connected to the charging port 280 via the charging cable 510. The electricity output from the charger 500 is input (supplied) to the charging port 280 via the charging cable 510. The charging cable 510 includes a first plug 511 and a second plug 512. The first plug 511 is connected to the charger 500 and the second plug 512 is connected to the charging port 280. Also, the charging cable 510 includes a signal cable attached to the power cable. The signal cable mediates communication between the electric vehicle 20 and the charger 500. Thus, each of the first plug 511 and the second plug 512 is provided with a power connector and a signal connector.

The converter 290 is provided between the secondary battery BT and the charging port 280. The converter 290 converts an electric current introduced from the charger 500 via the charging port 280, for example, an AC, into a DC. The converter 290 outputs the DC obtained through the conversion to the secondary battery BT and causes the secondary battery BT to store electric power (charges the secondary battery BT).

Figure 3:
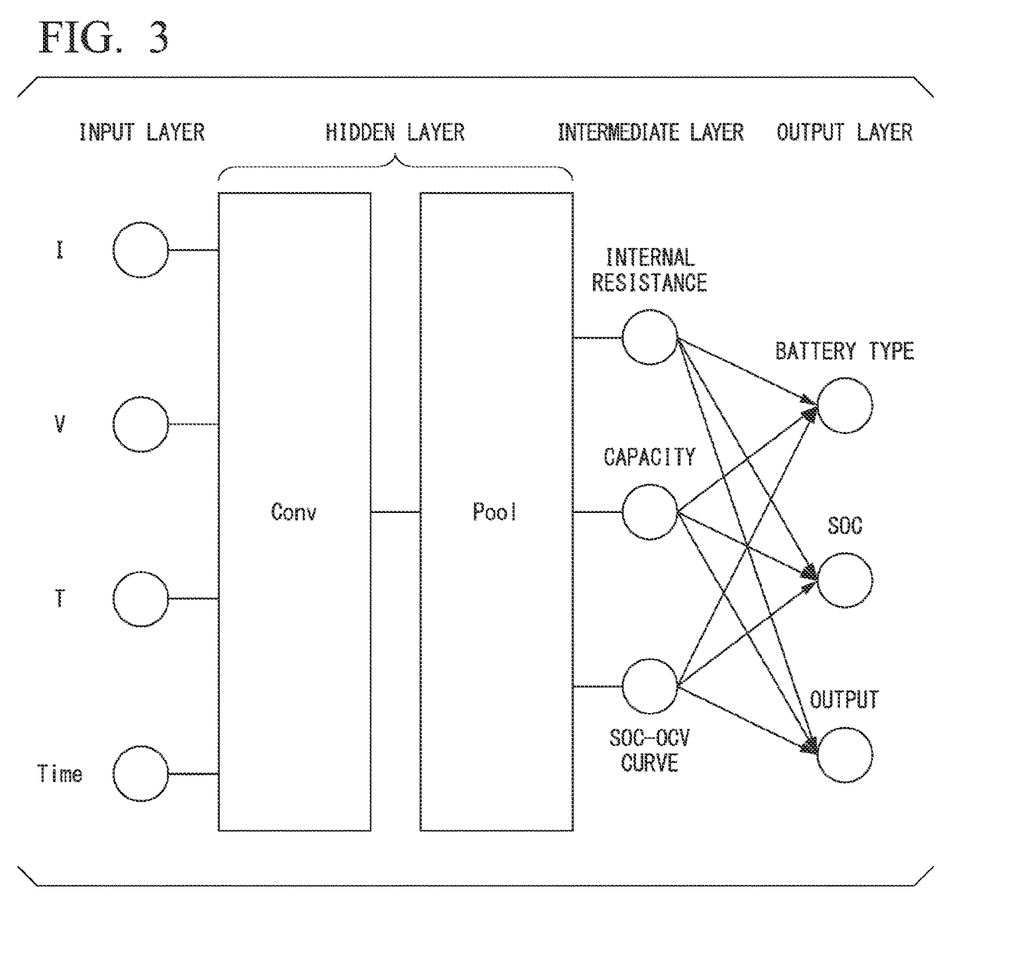
FIG. 3 is a diagram schematically showing an example of a battery model generated in the battery identification system.

Next, an example of the battery model generated by the model generator 130 will be described. FIG. 3 is a diagram schematically showing an example of a battery model generated in the battery identification system 1. Also, the example of the battery model shown in FIG. 3 is an example of the battery model generated by the model generator 130 when the battery property information includes elapsed time.

In an example of the battery model shown in FIG. 3, the battery model has an input layer, a hidden layer, and an output layer. The hidden layer of the battery model includes, for example, one or more convolution neural networks (CNNs). The CNN includes a convolutional layer (Cony) and a pooling layer (Pool). An electric current (I), a voltage (V), a temperature (T), and total elapsed usage time (Time) of the secondary battery BT are input as input information to the input layer of the battery model. Here, the total elapsed usage time is the time that has elapsed (the elapsed time) after the in-vehicle battery 22 was manufactured. An intermediate layer of the battery model outputs internal resistance, a capacity, and an SOC-open circuit voltage (OCV) curve of the secondary battery BT as output information. Also, the output layer of the battery model is connected to the intermediate layer through, for example, full coupling, and outputs a battery type, an SOC, and an output of the secondary battery BT as presentation information. Parameters of the hidden layer are optimized by performing machine learning using the input to the input layer as learning data and using data to be output from the intermediate layer or the output layer as teacher data.

The model generator 130 generates a battery model by inputting the electric current, the voltage, the temperature, and the total elapsed usage time of the secondary battery BT into the input layer and performing machine learning. Also, when the electric current, the voltage, the temperature, and the total elapsed usage time of the identical secondary battery BT are input to the input layer, the model generator 130 updates the corresponding battery model by performing machine learning. The model generator 130 causes the storage 150 to store the generated or updated battery model.

By using the battery model, the controller 120 ascertains the battery properties of the secondary battery BT built into the in-vehicle battery 22 installed in the electric vehicle 20. More specifically, the controller 120 uses the presentation information including the battery type, the SOC, and the output output from the output layer of the battery model. The controller 120 determines whether or not control information corresponding to the secondary battery BT having identical battery properties has been stored in the storage 150 on the basis of the ascertained battery properties of the secondary battery BT. Also, the controller 120 can determine whether or not the secondary battery BT has failed on the basis of the output information output from the intermediate layer of the battery model.

By using the battery model, the control information creator 140 sets an optimum discharging control method for the secondary battery BT built into the in-vehicle battery 22 installed in the electric vehicle 20 and creates the control information of the ECU. More specifically, the control information creator 140 uses output information including the internal resistance, the capacity, and the SOC-OCV curve output from the intermediate layer of the battery model when the discharge control method of the secondary battery BT is set. Also, the control information creator 140 can present information about the secondary battery BT whose discharging control method has been set using presentation information including the battery type, the SOC, and the output output from the output layer of the battery model.

Figure 4:
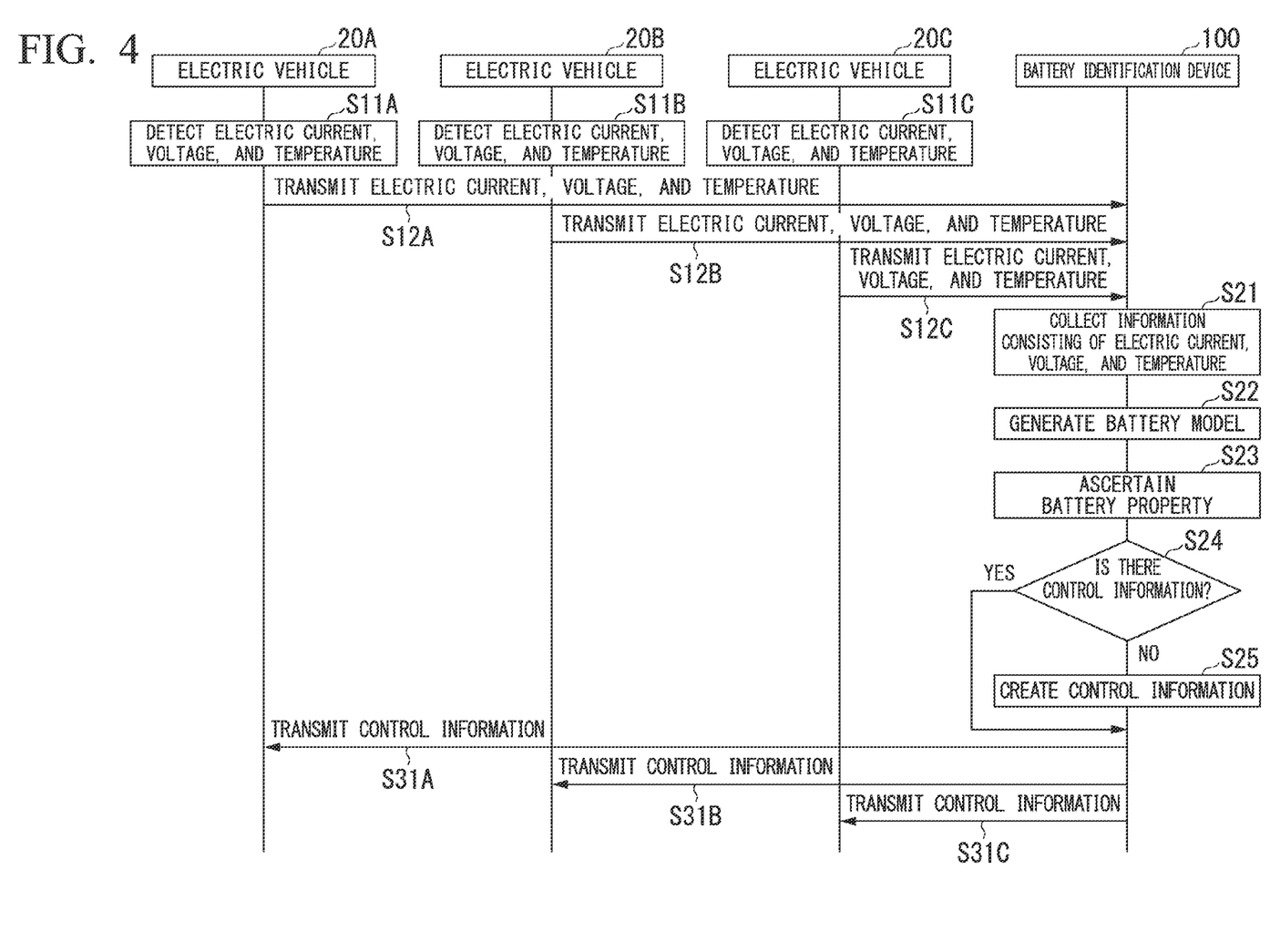
FIG. 4 is a sequence diagram showing a flow of a process in the battery identification system.

Next, a process of the battery identification system 1 will be described. FIG. 4 is a sequence diagram showing a flow of the process of the battery identification system 1. In FIG. 4, an example of a process between the three electric vehicles 20 of the electric vehicle 20A, the electric vehicle 20B, and the electric vehicle 20C, and the battery identification device 100 is shown. An example in which battery property information is transmitted from each of the three electric vehicles 20 and the battery identification device 100 transmits control information to each of the three electric vehicles 20 is shown.

In the example of the process of the battery identification system 1 shown in FIG. 4, first, the information acquirer 21A (more specifically, the battery sensor 250) provided in the electric vehicle 20A detects the electric current, the voltage, and the temperature of a secondary battery BT built into the in-vehicle battery 22A (together with total elapsed usage time thereof) (step S11A). Also, the information acquirer 21B (more specifically, the battery sensor 250) provided in the electric vehicle 20B detects the electric current, the voltage, and the temperature of a secondary battery BT built into the in-vehicle battery 22B (together with a total elapsed usage time thereof) (step S11B). Also, the information acquirer 21C (more specifically, the battery sensor 250) provided in the electric vehicle 20C detects the electric current, the voltage, and the temperature of a secondary battery BT built into the in-vehicle battery 22C (together with total elapsed usage time thereof) (step S11C).

Subsequently, the information acquirer 21A transmits information consisting of the detected electric current, voltage, and temperature of the secondary battery BT (including the total elapsed usage time thereof) to the battery identification device 100 as battery property information (step S12A). Thereby, the communicator 110 provided in the battery identification device 100 receives the battery property information transmitted by the information acquirer 21A of the electric vehicle 20A. Also, the information acquirer 21B transmits information consisting of the detected electric current, voltage, and temperature of the secondary battery BT (including the total elapsed usage time thereof) to the battery identification device 100 as battery property information (step S12B). Thereby, the communicator 110 provided in the battery identification device 100 receives the battery property information transmitted by the information acquirer 21B of the electric vehicle 20B. Also, the information acquirer 21C transmits information consisting of the detected electric current, voltage, and temperature of the secondary battery BT (including the total elapsed usage time thereof) to the battery identification device 100 as battery property information (step S12C). Thereby, the communicator 110 provided in the battery identification device 100 receives the battery property information transmitted by the information acquirer 21C of the electric vehicle 20C.

Subsequently, the controller 120 provided in the battery identification device 100 acquires the battery property information (information consisting of the electric currents, the voltages, and the temperatures including the total elapsed usage times) of the secondary batteries BT transmitted by the electric vehicle 20A, the electric vehicle 20B, and the electric vehicle 20C received by the communicator 110 and causes the battery property information to be stored and collected in the storage 150 (step S21).

Subsequently, the controller 120 instructs the model generator 130 to generate a battery model based on the battery property information stored in the storage 150. Thereby, the model generator 130 generates the battery model of the secondary battery BT built into the in-vehicle battery 22 installed in each electric vehicle 20 on the basis of the battery property information stored in the storage 150 in accordance with the instruction from the controller 120 (step S22). More specifically, the model generator 130 generates a battery model based on states of the electric current, the voltage, the temperature, and the like included in the battery property information of the secondary battery BT built into the in-vehicle battery 22A installed in the electric vehicle 20A. Also, the model generator 130 generates the battery model based on states of the electric current, the voltage, the temperature, and the like included in the battery property information of the secondary battery BT built into the in-vehicle battery 22B installed in the electric vehicle 20B. Also, the model generator 130 generates the battery model based on states of the electric current, the voltage, the temperature, and the like included in the battery property information of the secondary battery BT built into the in-vehicle battery 22C installed in the electric vehicle 20C. The model generator 130 causes the storage 150 to store the generated battery models.

Subsequently, the controller 120 ascertains the battery properties of the secondary battery BT built into the in-vehicle battery 22 currently installed in each electric vehicle 20 on the basis of each battery model generated by the model generator 130 (step S23). More specifically, the controller 120 ascertains the battery properties of the secondary battery BT built into the in-vehicle battery 22A currently installed in the electric vehicle 20A. Also, the controller 120 ascertains the battery properties of the secondary battery BT built into the in-vehicle battery 22B currently installed in the electric vehicle 20B. Also, the controller 120 ascertains the battery properties of the secondary battery BT built into the in-vehicle battery 22C currently installed in the electric vehicle 20C.

Subsequently, the controller 120 determines whether or not the control information corresponding to the secondary battery having battery properties identical to the ascertained battery properties of each of the secondary batteries BT has already been stored in the storage 150 (step S24). More specifically, the controller 120 determines whether or not the control information corresponding to the ascertained battery properties of each secondary battery BT has been stored by searching for battery properties identical to the ascertained battery properties of each secondary battery BT from a plurality of battery properties stored in the storage 150. Also, the controller 120 may search for battery properties including battery properties similar to the ascertained battery properties of each of the secondary batteries BT from the battery properties stored in the storage 150. In this case, when the identical battery properties have not been found and only the similar battery properties have been found, control information corresponding to the found similar battery properties may be treated as control information corresponding to the ascertained battery properties of the secondary battery BT.

When it is confirmed that the control information corresponding to the secondary battery having battery properties identical to the ascertained battery properties of each of the secondary batteries BT has been stored in the storage 150 in step S24, the controller 120 proceeds to step S31A.

On the other hand, when it is confirmed that the control information corresponding to the secondary battery having battery properties identical to the ascertained battery properties of each of the secondary batteries BT has not been stored in the storage 150 in step S24, the controller 120 instructs the control information creator 140 to create control information based on the battery model generated by the model generator 130 and stored in the storage 150. Thereby, the control information creator 140 generates the control information of the ECU corresponding to the secondary battery BT built into the in-vehicle battery 22 installed in each electric vehicle 20 on the basis of the battery model stored in the storage 150 in accordance with the instruction from the controller 120 (step S25). More specifically, the control information creator 140 sets an optimum discharging control method for the secondary battery BT on the basis of the battery model of the secondary battery BT built into the in-vehicle battery 22A installed in the electric vehicle 20A and creates optimized control information of the ECU. Also, the control information creator 140 sets an optimum discharging control method for the secondary battery BT on the basis of the battery model of the secondary battery BT built into the in-vehicle battery 22B installed in the electric vehicle 20B and creates optimized control information of the ECU. Also, the control information creator 140 sets an optimum discharging control method for the secondary battery BT on the basis of the battery model of the secondary battery BT built into the in-vehicle battery 22C installed in the electric vehicle 20C and creates optimized control information of the ECU. The control information creator 140 causes the storage 150 to store the created control information.

Subsequently, the controller 120 instructs the communicator 110 to transmit the control information of the ECU corresponding to the secondary battery BT built into the in-vehicle battery 22A installed in the electric vehicle 20A created by the control information creator 140 to the electric vehicle 20A. Thereby, the communicator 110 transmits the control information of the ECU stored in the storage 150 and indicated in the instruction to the electric vehicle 20A (step S31A). Also, the controller 120 instructs the communicator 110 to transmit the control information of the ECU corresponding to the secondary battery BT built into the in-vehicle battery 22B installed in the electric vehicle 20B created by the control information creator 140 to the electric vehicle 20B. Thereby, the communicator 110 transmits the control information of the ECU stored in the storage 150 and indicated in the instruction to the electric vehicle 20B (step S31B). Also, the controller 120 instructs the communicator 110 to transmit the control information of the ECU corresponding to the secondary battery BT built into the in-vehicle battery 22C installed in the electric vehicle 20C created by the control information creator 140 to the electric vehicle 20C. Thereby, the communicator 110 transmits the control information of the ECU stored in the storage 150 and indicated in the instruction to the electric vehicle 20C (step S31C).

According to a flow of the above process, in the battery identification system 1, the battery identification device 100 generates a battery model by modeling properties of a secondary battery built into the in-vehicle battery 22 installed in each electric vehicle 20 on the basis of battery property information acquired from each electric vehicle 20 and generates and transmits control information of the ECU provided in each electric vehicle 20 on the basis of the generated battery model. Thereby, the ECU provided in each electric vehicle 20 controls the driving of the electric motor M on the basis of the control information transmitted by the battery identification device 100.

As described above, according to the mode for carrying out the present invention, the battery identification device 100 constituting the battery identification system 1 generates a battery model by modeling the properties of the secondary battery BT provided in the electric vehicle 20 on the basis of the battery property information of the secondary battery BT detected by the information acquirer 21 provided in the electric vehicle 20 constituting the battery identification system 1. In the battery identification system 1, the battery identification device 100 creates control information of the ECU provided in the electric vehicle 20 on the basis of the generated battery model and transmits the control information to the electric vehicle 20. Thereby, the ECU provided in the electric vehicle 20 to which the battery identification system 1 of the mode for carrying out the present invention is applied can control driving of the electric motor M, i.e., traveling of the electric vehicle 20, on the basis of control information optimized for the secondary battery BT built into the currently installed in-vehicle battery 22A. Thereby, the electric vehicle 20 to which the battery identification system 1 of the mode for carrying out the present invention is applied can travel smoothly.

Moreover, in the mode for carrying out the present invention, the battery identification device 100 stores and collects (accumulates) the generated battery model and the created ECU control information in the storage 150. Thus, in the mode for carrying out the present invention, even if a new in-vehicle battery 22 is installed in the electric vehicle 20, it is possible to transmit control information of the ECU created on the basis of battery properties similar to the battery properties of the secondary battery BT built into the in-vehicle battery 22 to the electric vehicle 20.

Also, in the mode for carrying out the present invention, the battery identification device 100 updates the battery model or the control information stored in the storage 150 as necessary. Thus, in the mode for carrying out the present invention, when the battery properties of the secondary battery BT built into the in-vehicle battery 22 newly installed in the electric vehicle 20 deviate from battery properties of another secondary battery BT stored in the storage 150, it is possible to store and collect (accumulate) the battery model or the control information as a battery model or control information of another secondary battery BT in the storage 150.

Thereby, the user of the electric vehicle 20 to which the battery identification system 1 of the mode for carrying out the present invention is applied can select the in-vehicle battery 22 which is installed in the electric vehicle 20 regardless of a manufacturer of the in-vehicle battery 22. Also, the manufacturer of the secondary battery trying to enter the market to which the battery identification system 1 of the mode for carrying out the present invention is applied can supply the in-vehicle battery 22 to the market with an easy mind.

Although modes for carrying out the present invention have been described above using the embodiments, the present invention is not limited to the embodiments and various modifications and replacements can be applied without departing from the spirit and scope of the present invention.

REFERENCE SIGNS LIST

1 Battery identification system
100 Battery identification device
20, 20A, 20B, 20C Electric vehicle
110 Communicator
120 Controller
130 Model generator
140 Control information creator
150 Storage
21, 21A, 21B, 21C Information acquirer
22, 22A, 22B, 22C In-vehicle battery
BT Secondary battery
NW Network
M Electric motor
210 Drive wheel
220 Brake device
230 Vehicle sensor
240 PCU
241 Converter
242 VCU
243 Controller
250 Battery sensor
260 Communication device
270 Display device
271 Display
272 Display controller
280 Charging port
290 Converter
500 Charger
510 Charging cable
511 First plug
512 Second plug

What is claimed is:

1. A battery identification system comprising:
an information acquirer configured to acquire a property of a battery installed in an electric vehicle and transmit the property as battery property information; and
a battery identification device configured to collect the battery property information transmitted by a plurality of electric vehicles, generate a battery model by modeling the property of the battery on the basis of the collected battery property information, create control information according to the property of the battery for controlling traveling of each electric vehicle on the basis of the generated battery model, and provide the control information suitable for each electric vehicle,
wherein the battery identification device comprises:
a controller configured to ascertain the property of the battery and instruct to generate the battery model and create the control information;
a model generator configured to generate the battery model on the basis of the collected battery property information;
a control information creator configured to create the control information suitable for the property of the battery on the basis of the battery model; and
a communicator configured to receive the battery property information transmitted by the electric vehicle and transmit the control information suitable for the electric vehicle.

2. The battery identification system according to claim 1,
wherein the battery property information comprises at least an electric current, a voltage, and a temperature of the battery,
wherein the model generator is configured to generate the battery model for receiving at least the electric current, the voltage, and the temperature as input information and outputting at least one of internal resistance, a capacity, and a state of charge (SOC)-open circuit voltage (OCV) curve of the battery as output information, and
wherein the control information creator is configured to create the control information using the output information of the battery model.

3. The battery identification system according to claim 2,
wherein the model generator is configured to generate the battery model for outputting at least one of a type, an SOC, and an output of the battery as presentation information, and
wherein the controller is configured to ascertain the property of the battery using the presentation information of the battery model.

4. The battery identification system according to claim 3, wherein the controller is configured to cause the communicator to transmit information about the ascertained property of the battery in a case where the ascertained property of the battery is not suitable for controlling the traveling of the electric vehicle.

5. The battery identification system according to claim 1, wherein the information acquirer comprises:
- a battery detector configured to detect an electric current, a voltage, and a temperature of the battery; and
- a communication device configured to transmit the electric current, the voltage, and the temperature that have been detected.

6. A battery identification method comprising:
- acquiring, by an information acquirer, a property of a battery installed in an electric vehicle and transmitting the property as battery property information; and
- collecting, by a battery identification device, the battery property information transmitted by information acquirers provided in a plurality of electric vehicles, generating a battery model by modeling the property of the battery on the basis of the collected battery property information, creating control information according to the property of the battery for controlling traveling of each electric vehicle on the basis of the generated battery model, and providing the control information suitable for each electric vehicle, wherein the battery identification method comprises:
- by the battery identification device, ascertaining the property of the battery and instructing to generate the battery model and create the control information;
- generating, by the battery identification device, the battery model on the basis of the collected battery property information;
- creating, by the battery identification device, the control information suitable for the property of the battery on the basis of the battery model; and
- by the battery identification device, receiving the battery property information transmitted by the electric vehicle and transmitting the control information suitable for the electric vehicle.

* * * * *